(12) United States Patent
Furuta et al.

(10) Patent No.: US 9,087,822 B2
(45) Date of Patent: Jul. 21, 2015

(54) SEMICONDUCTOR DEVICE

(71) Applicant: Hitachi, Ltd., Chiyoda-ku, Tokyo (JP)

(72) Inventors: Futoshi Furuta, Tokyo (JP); Kenichi Osada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/043,823

(22) Filed: Oct. 1, 2013

(65) Prior Publication Data
US 2014/0091478 A1  Apr. 3, 2014

(30) Foreign Application Priority Data
Oct. 2, 2012 (JP) .................................. 2012-219919

(51) Int. Cl.
H01L 23/48 (2006.01)
H01L 27/02 (2006.01)

(52) U.S. Cl.
CPC ............ H01L 23/481 (2013.01); H01L 27/0207 (2013.01); H01L 2224/16145 (2013.01); H01L 2924/13091 (2013.01)

(58) Field of Classification Search
CPC ......... H01L 23/48; H01L 23/52; H01L 29/40; H01L 23/481; H01L 2924/01079; H01L 23/5226
USPC ............................... 257/48, 666, 774; 365/43
See application file for complete search history.

(56) References Cited

U.S. PATENT DOCUMENTS

| 8,659,136 B2 * | 2/2014 | Youn et al. ................ 257/686 |
| 2009/0321893 A1 | 12/2009 | Somasekhar et al. | |
| 2011/0057819 A1 * | 3/2011 | Ide et al. .................... 341/100 |
| 2012/0162836 A1 * | 6/2012 | Furuta et al. ................ 361/56 |
| 2012/0267786 A1 * | 10/2012 | Kirby et al. ................. 257/770 |
| 2013/0001795 A1 * | 1/2013 | Lim et al. .................... 257/774 |
| 2013/0285739 A1 * | 10/2013 | Blaquiere et al. ........... 327/565 |

FOREIGN PATENT DOCUMENTS

| JP | 2010-016377 A | 1/2010 |
| JP | 2013-065870 A | 4/2013 |
| JP | 2013-084697 A | 5/2013 |

OTHER PUBLICATIONS

Takahashi, K. et al., "Current Status of Research and Development for Three-Dimensional Chip Stack Technology", Japanese Journal of Applied Physics, vol. 40, pp. 3032-3037, 2001.

Van Der Plas, G. et al., "Design Issues and Considerations for Low-Cost 3-D TSV IC Technology", IEEE Journal of Solid State Circuits, vol. 46, No. 1, pp. 293-307, Jan. 2011.

Cho, Sungdong, "Technical Challenges in TSV Integration to Si", SEMATECH Symposium Korea 2011, Oct. 27, 2011, pp. 1-33 [Samsung IITC 2011].

* cited by examiner

Primary Examiner — Phuc Dang
(74) Attorney, Agent, or Firm — Miles & Stockbridge P.C.

(57) ABSTRACT

To provide a semiconductor device having a high efficiency of arranging a TSV, there is provided a semiconductor device which is stacked with a semiconductor chip, and in which the semiconductor chips contiguous each other are electrically connected by plural TSVs, the semiconductor chip includes a core circuit and plural IO circuits arranged at a surrounding thereof, the TSV is arranged in the core circuit, and a pitch of arranging the TSVs is an integer-fold of a cell pitch of a library configuring the core circuit.

14 Claims, 20 Drawing Sheets

SECTIONAL VIEW

PLANE VIEW

PLANE VIEW

SECTIONAL VIEW

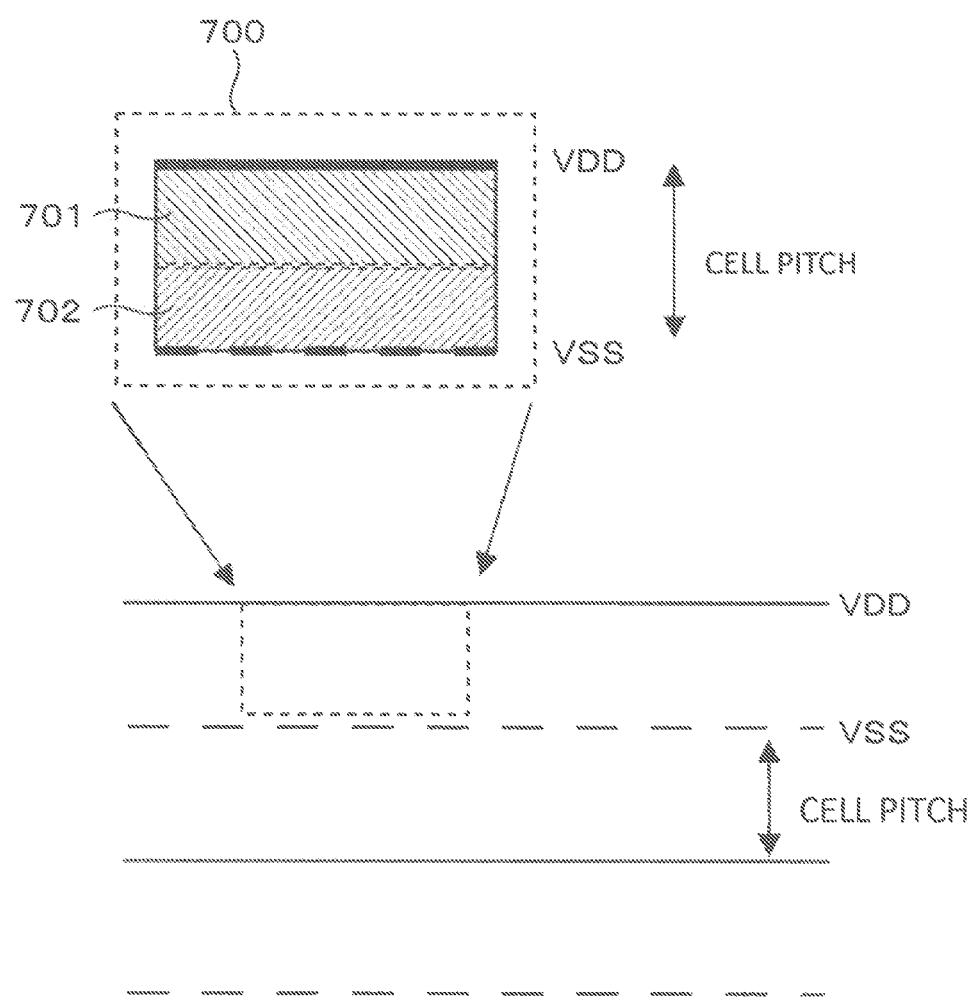

PLANE VIEW

SECTIONAL VIEW

NON-INTEGER-FOLD    INTEGER-FOLD

ODD-NUMBER-FOLD    EVEN-NUMBER-FOLD

PLANE VIEW

SECTIONAL VIEW

SECTIONAL VIEW

PLANE VIEW

SEMICONDUCTOR DEVICE

CLAIM OF PRIORITY

The present application claims priority from Japanese patent application JP 2012-219919 filed on Oct. 2, 2012, the content of which is hereby incorporated by reference into this application.

FIELD OF THE INVENTION

The present invention relates to a semiconductor device including a TSV.

BACKGROUND OF THE INVENTION

A significant feature of a semiconductor device, for example, C-MOS semiconductor integrated circuit device resides in a scaling rule stating that when a size of an element configuring the device is miniaturized, an increase in an operating frequency and a reduction in power consumption are achieved. Heretofore, an integration degree per chip (semiconductor chip) and a performance have been improved by miniaturizing the element. However, a slow down tendency emerges in the improvement of the integration degree or the chip performance with a progress in the miniaturization. As reason therefor, a limit in the miniaturization per se, actualization of a delay in a wiring between elements by increasing the operating speed of the element, an increase in power consumption owing to a leakage problem by miniaturizing the element are enumerated.

On the other hand, in a case of constructing an information processing system of a constant scale, there is a limit in a function of capable of integrating elements in a single chip. Therefore, it is indispensable to arrange plural chips and connect chips to each other. Heretofore, a direction of arranging chips is horizontal, and a transmission distance of a signal between chips is a length equal to or larger than one side of the chip. Therefore, even if an operating speed per chip is increased by the miniaturization, time is still taken in transmission between chips, and therefore, an increase in the operating speed of a total of the system is difficult.

A semiconductor device represented by K. Takahashi, et. al., Japanese Journal of Applied Physics, 40, 3032-3037 (2001) is proposed to deal with the slow down in the improvement of the chip performance or an improvement in the performance of a total system. FIG. 1A shows an outline thereof. FIG. 1A is an outline sectional view showing an example of a semiconductor device chips stacked. K. Takahashi, et. al., Japanese Journal of Applied Physics, 40, 3032-3037 (2001) discloses a technology in which other semiconductor chips are three-dimensionally stacked on upper and lower sides of a semiconductor chip 100, and information and power are transmitted by a through silicon via (TSV) connecting the chips TSV. It can be expected that a delay in a wiring between elements in a chip and a delay in transmission between the chips which becomes a bottleneck of a total of the system can considerably be reduced, by conducting transmission at a long distance wiring of a signal in the chip and a signal wiring between the chips by a TSV directly above the chip. Incidentally, notation 101 designates a conductor through a silicon substrate (TSV conductor), notation 102 designates a pad, notation 103 designates an insulating layer, notation 104 designates a pillar, notation 105 designates a bump, and notation 110 designates the silicon (Si) substrate.

FIG. 1B is a detailed sectional view of the chip configuring the semiconductor device shown in FIG. 1A. A TSV 130 used here is constructed, by a structure of literally penetrating a silicon substrate and a back face of the substrate by the TSV conductor 101. The TSV conductor 101 is brought into contact with the pad 102 by being received by a wiring layer (wiring in chip) 106 at a circuit face of the chip which is formed with MOSFET 120 or the like including a drain area 111, a source area 112, and a gate electrode 113. The pad 102 and the TSV conductor 101 are brought into contact with other chip via the pillar 104 and the bump 105 configured by tin or the like. The insulating layer 103 is formed and insulation is maintained at portions where the conductors and a silicon (Si) substrate 107 of the chip are brought into contact.

In a case of arranging the TSV in the chip, a circuit element cannot be placed not only at an area of the TSV conductor but at a surrounding thereof. The area is referred to as Keep Out Zone (KOZ). There are two reasons of necessitating the keep out zone. The first reason is derived from a patterning accuracy in forming a TSV. FIG. 2A illustrates views for explaining a relationship between the TSV and KOZ in a chip configuring a semiconductor device staked with chips, an upper view thereof is a sectional view, and a lower view thereof is a plane view of an essential portion. As shown in FIG. 2A, a wiring layer (wiring in chip) 206 connected with a pillar 204 and is formed, to be larger than a diameter of the TSV conductor 101 of the TSV. When a position of the via formed at the silicon substrate is actually deviated from a design value, also an end portion of the TSV conductor 101 is similarly deviated. Unless KOZ is defined as an area of prohibiting to arrange a circuit element here, the circuit element and the TSV conductor 101 are brought into contact, and the circuit is erroneously operated. An accuracy thereof depends on an exposure step technology. Ordinarily, the accuracy is in an order of several μm in contact exposure, and several 100 nm in stepper exposure.

The second reason is that a property of a circuit element arranged at a periphery of a TSV is changed by a stress of the TSV conductor effected on an Si substrate. Copper is ordinarily used as a material of configuring the TSV conductor 101. Thermal expansion coefficients of the copper and silicon that is a material of a substrate differ from each other. Therefore, a stress is generated at the periphery of the TSV after an elapse of a heating step after forming the TSV. A drain current or a threshold voltage is changed by an influence of presence or absence of a stress at a substrate configuring FET 220. Incidentally, notation 220 includes MOSFET or MISFET. An isolation distance from the conductor owing to the second reason ranges from several μm to about 10 μm although depending on an allowable variation width. FIG. 2B illustrates views for explaining a relationship between a TSV and KOZ in a chip configuring other semiconductor device stacked with chips, an upper view thereof is a sectional view, and a lower view thereof is a plane view of an essential portion. As shown in FIG. 2B, even when an exposure step technology is progressed, and the wiring 206 can sufficiently be downsized, FET 220 cannot be arranged in KOZ owing to an influence of stress. Researches on the influence are described in details in Geert Van der Plas, et. al., IEEE Journal of Solid State Circuit, 46, 1, 293-307 (2011), and Samsung, IITC 2011. Incidentally, notation 202 designates a pad.

On the other hand, from a view point of arranging a circuit, when there is an area in which a circuit cannot be configured as in a TSV or KOZ, although the circuit can be arranged at an individual transistor level, the circuit may not be arranged at a level of a circuit configured by plural transistors of a comparator or a logical circuit. The portion at which the circuit cannot be arranged becomes a dead space as it is. A size of the dead space depends on a minimum dimension of a circuit used, and is around 1 µm in an ordinary technology.

It is necessary to take the area of KOZ and the dead space at which a circuit element cannot be arranged at a periphery of the via into consideration in designing to arrange the TSV from the reason described above.

A location of arranging a TSV is significantly dependent upon a stacking architecture. In this example, an explanation will be given of the location by classifying the stacking architecture into low density mounting and high density mounting in accordance with a mounting density of a TSV. FIG. 3A is a conceptual view in a case where a TSV is mounted at a low density (TSV is arranged in an IO circuit) in a semiconductor device mounted with a chip, and FIG. 3B is a conceptual view in a case where a TSV is mounted at a high density (TSV is arranged in a logical cell) in a semiconductor device stacked with chips.

First, a number of pieces of TSVs between chips is assumed to be several 100 pieces through several 1000 pieces in the low density mounting shown in FIG. 3A. In this case, plural IC's are connected between stacked chips by using TSVs instead of connecting the plural IC's by using a wiring on a mounting substrate of a background art. In this case, pins of power sources supplied to chips or input/output pins of an IO circuit connected to outside of IC are mainly connected between stacked chips. A stacked memory is pointed out as such a stacking example. The TSVs are generally placed below or contiguous to input/output pads connected to the IO circuit.

On the other hand, the high density mounting shown in FIG. 3B assumes TSVs exceeding 10000 pieces per chip. In this case, element circuits are connected between the stacked chips by using TSVs instead of connecting the element circuits in the same chip by wirings in the chip. Here, the element circuit receives a signal from an IO circuit, and is a portion which is not directly connected to outside of IC. The element circuit is referred to as a core circuit in the meaning of differentiating from the IO circuit. In this case, power sources of element circuit levels of core circuits or inputs/outputs of element circuits are mainly connected between the stacked chips. In such examples of stacked chips, three-dimensional FPGA which arranges and wires logical tiles of FPGA (Field Programmable Gate Array) in three-dimensional directions, and connection of a microprocessor (CPU) and a memory by a wiring having a large bus width are enumerated. The TSV is arranged not by interposing an IO circuit but between element circuits, that is, at an inner portion of a core circuit (for example, refer to Japanese Unexamined Patent Application Publication No. 2010-016377).

A TSV can be classified to that in a case of being arranged at an IO circuit and that in a case of being arranged at a core circuit in view of the stacking examples. FIG. 4 shows a typical layout of a semiconductor chip. A core circuit 401 is laid out at a center, and an IO circuit 402 is arranged at a surrounding thereof in consideration of a number of pins connected to the semiconductor chip, and a number of inputs and outputs. Incidentally, notation 403 designates a pad. The following problem is posed in consideration of KOZ of a TSV in respective cases.

SUMMARY OF THE INVENTION

An IO circuit 500 has a function of an interface between a chip and outside of a package. FIG. 5 illustrates views showing a configuration of an IO circuit in a chip configuring a semiconductor device stacked with chips and an arrangement of a TSV according to an investigation of the inventors, an upper view thereof is an outline plane view, and a lower view thereof is an outline sectional view. A core circuit 501 is reached from an IO pad 502 via an ESD (Electric Static Damage) preventing diode 503 and an input/output buffer 504.

First, a feature of the circuits resides in that an operating voltage is high different from that of the core circuit 501. This is derived from a standard of connecting IC's. Therefore, a thick gate insulating film is used for FET of the input/output buffer 504 of the IO circuit 500. An outer pin connected to the IO circuit 500 is a portion in direct contact with an external environment, and static electricity is liable to flow into the portion. Static electricity destructs a gate oxide trim and a channel of FET. In order to ensure a resistance against ESD, the IO circuit 500 is connected with a clamping FET as the ESD preventing diode 503 connected to a gate of FET on an input side, and channel lengths of the clamping FET and an output side driver FET are prolonged.

According to Geert Van der Plas, et. al., IEEE Journal of Solid State Circuit, 46, 1, 293-307 (2011), the feature of the devices, that is, the thick-film type gate oxide and the long channel are operated in a direction of increasing KOZ. Therefore, it is anticipated that KOZ is increased by arranging the TSV at the IO circuit 500 more than arranging the TSV at the core circuit 501. The reason that this has not been regarded to be problematic heretofore is that the TSV 505 is arranged directly below the IO pad 502 as shown in FIG. 5. A chip before a stacking process needs to be tested in some way, and therefore, the IO pad 502 is frequently provided even to a chip which is designed on the premise of connecting to a TSV as a stylus touching pad.

However, when the integration degree is increased by miniaturization, an impact on an IO circuit 600 of a chip is enhanced. Therefore, a case of placing a circuit element (ESD prevention diode 603) even directly below a semiconductor chip IO pad 602 as in FIG. 6A is increased. FIG. 6A illustrates views in a case of highly integrating an IO circuit in a chip configuring a semiconductor device a chip of which is arranged on a plane, an upper view thereof is an outline plane view, and a lower view thereof is an outline sectional view.

In such a situation, it is very difficult to arrange a TSV directly below the IO pad 602 even in a stacked chip. FIG. 6B illustrates views showing an arrangement of a TSV in a case of highly integrating an IO circuit in accordance with a configuration of FIG. 6A in a chip configuring a semiconductor device stacked with chips according to an investigation of the inventors, an upper view thereof is an outline plane view, and a lower view thereof is an outline sectional view. As shown in FIG. 6B, it is necessary to arrange circuit elements (ESD prevention diodes) 603a and 603b arranged to be placed below a pad at a surrounding of the IO pad 602 by avoiding a TSV conductor. Even when the circuits 603a and 603b can be arranged at the surrounding of the IO circuit 600, it is necessary to enlarge KOZ by about 10 µm, and therefore, an arrangement efficiency (here, an arrangement area of a total of the circuit elements of a transistor and the like as compared with a total of a chip area) is significantly reduced. Incidentally, notation 604 designates an input/output buffer, notation 601 designates a core circuit.

Here, assume the IO pad 602 including 200 pieces of power sources at a chip of 5 mm square. Assume KOZ of 10 µm by arranging 4 pieces of TSVs of 10 µm square in parallel per single pad. An occupation rate of the TSV occupying in a total of the chip at this occasion is about 3%, and an impact effected to an area is not inconsiderable.

On the other hand, according to FET used, for the core circuit 601, a gate film, thickness of FET is thinner and a channel length is shorter than those of FET of the IO circuit 600. Therefore, even when the TSV is arranged, an influence of a stress of a TSV conductor is more difficult to be effected than in the IO circuit 600, and KOZ can be downsized to about 2 to 3 μm. When the occupation rate is calculated similar to the above-described, the occupation rate is reduced to one tenth of about 0.4%.

However, a great number of the TSVs are arranged between the element circuits, and therefore, a degree of freedom of design is significantly restricted in comparison with that of a case of the IO circuit 600 from a view point of reducing a dead space.

Japanese Unexamined Patent Application Publication No. 2010-016377 is pointed out as a related art of a method of arranging the TSVs in the core circuit 601. According to the example, there is adopted a method of arranging a TSV by producing a portion without a circuit element between rows of circuits referred to as tracks by assuming a certain direction. In this case, a degree of freedom of arranging the TSV is guaranteed in a uniaxial direction. However, a reference is not made of an arrangement efficiency in consideration of a relationship between a circuit element configuring a core circuit and KOZ and a dead space.

Generally, in a core circuit, a macro cell referred to a standard cell is used. This is provided as a layout of defining a basic logical circuit (logical gate, flip-flop, multiplexer etc) to several kinds of vertical and horizontal sizes. FIG. 7A is a plane view showing an arrangement of a standard cell of a general core circuit. As shown in FIG. 7A, a standard cell 700 includes a VDD power source line and a VSS power source line on upper and lower sides. FIG. 7B shows details of a standard cell. An upper view of FIG. 7B is a plane view and a lower view thereof is a sectional view. PMOSFET 701 is formed on a side of the VDD line, and NMOSFET 702 is formed on a side of the VSS line. PMOSFET 701 and NMOSFET 702 are aligned in a form, along a line of running PMOSFET 701 and NMOSFET 702 in parallel in a unidirection (for example, horizontal direction) of matching kinds of power sources in a core circuit area in which power source lines of VDD and VSS are arranged alternately at constant intervals.

When a TSV is arranged at inside of a core circuit area arranged regularly in this way, it is necessary to not only consider KOZ at a periphery of the TSV but to consider an interference with an arrangement of a standard cell. Specifically, when a portion of KOZ is disposed at a portion of the standard cell, the whole cell cannot be arranged at the portion. That is, a dead space of an amount of 1 cell pitch is generated in addition to KOZ. Therefore, depending on an arrangement of the TSV to the core circuit, an arrangement efficiency of a circuit element is obliged, to be deteriorated, owing to the dead space comparable to KOZ.

As described above, summarizingly, in a design of a chip which needs to increase an integration degree, an influence of KOZ by arranging a TSV, or a dead space generated by KOZ significantly deteriorates an arrangement efficiency. Particularly, in arranging a TSV at an IO circuit, KOZ is significant, and therefore, an arrangement efficiency thereof is lower than that of a core circuit. Also, an arrangement of a TSV to a core circuit, particularly a circuit configured by a standard library may deteriorate a size of a dead space, that is, an arrangement efficiency depending on a way of the arrangement in view of a large or small relationship between the cell pitch and KOZ.

It is an object of the present invention to provide a semiconductor device having a high efficiency of arranging a TSV.

As an embodiment for achieving the object described above, there is provided a semiconductor device which is stacked with a chip formed by a semiconductor, and in which the chips contiguous to each other are electrically connected by plural TSVs, where the chip includes an IO circuit and a core circuit, and where the TSV is arranged at the core circuit, and a pitch of arranging the TSV is an integer-fold of a cell pitch of a library configuring the core circuit.

Further, there is provided a semiconductor device which is stacked with a semiconductor chip and in which the semiconductor chips contiguous to each other are electrically connected by plural TSVs, where the semiconductor chip includes a core circuit, and plural IO circuits arranged at a surrounding of the core circuit, and where the TSV is arranged at the core circuit and connected to a pad electrode of the IO circuit, a pitch of arranging the TSV is an integer-fold of a cell pitch of a library configuring the core circuit.

According to the present invention, a semiconductor device having a high efficiency of arranging TSVs can be provided.

BRIEF DESCRIPTION OF THE DRAWINGS

FIG. 7A is a plane view showing an arrangement of a standard cell in a general core circuit;

DETAILED DESCRIPTION OF THE PREFERRED EMBODIMENTS

Figure 8:
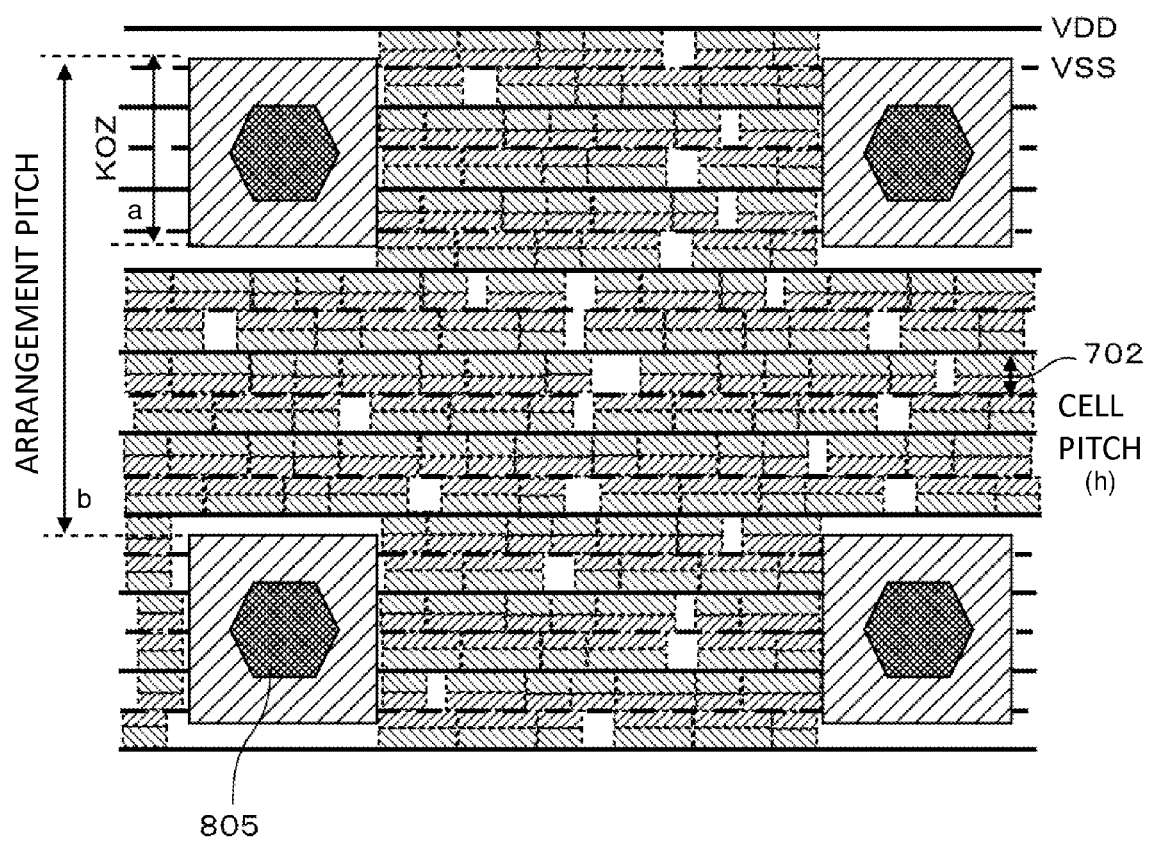
FIG. 8 is an arrangement view of a TSV in a core circuit in a chip configuring a semiconductor device according to an embodiment and a first embodiment of the present invention.

A semiconductor device according to the present embodiment is configured by plural semiconductor chips mounted to be stacked with each other, and connected by a TSV. Each of the semiconductor chips is configured by an IO circuit connected to outside and a core circuit connected, only to the IO circuit. FIG. 8 shows an arrangement view of a TSV in a core circuit in a chip configuring a semiconductor device according to the present embodiment. First, when a TSV 805 is arranged in a core circuit, an arrangement interval thereof is set to a cell pitch h of a standard cell configuring the core circuit, that is, even number-fold of a power source wiring interval. When a width of KOZ in a cell pitch direction (up and down direction of drawing) is designated by notation a, the following equation is satisfied, for a pertinent integer N.

$$(N-1) \times h < a < N \times h \tag{1}$$

Here, when an arrangement interval (arrangement pitch) of a TSV is designated by notation b, the following relationship is satisfied for a pertinent integer M.

$$b = 2Mh (2M > N) \tag{2}$$

Figure 9A:
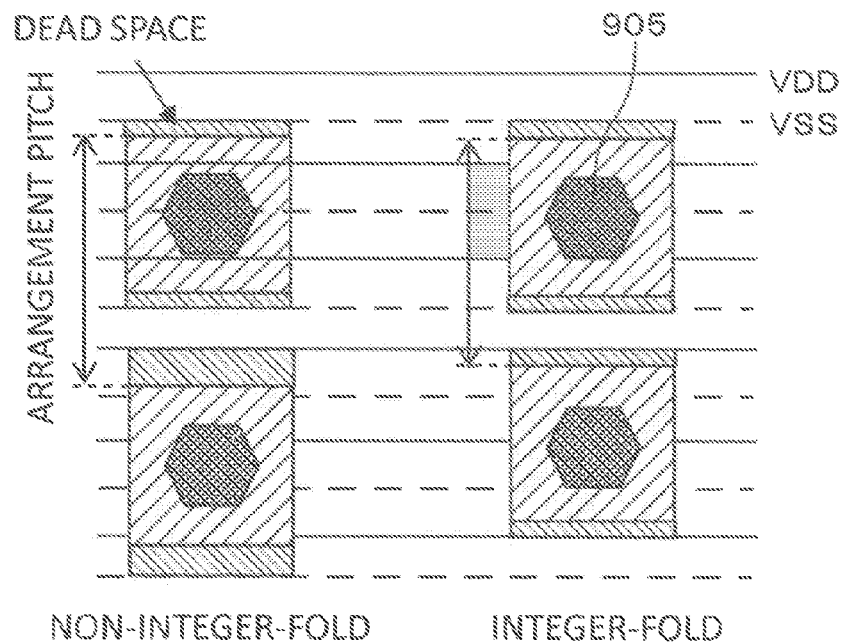
FIG. 9A is a view for explaining a change in a dead space when an arrangement pitch b of a TSV is changed, a left side of the view shows a case where an arrangement pitch is non-integer-fold of a cell pitch h, a right side thereof shows a case where the arrangement pitch b is integer-fold of the cell pitch h.

FIG. 9A is a view for explaining in a change in a dead space when the arrangement pitch b of a TSV 905 is changed, a left side thereof shows a case where the arrangement pitch b is non-integer-fold of a cell pitch h, and a right side thereof snows a case where the arrangement pitch b is integer-fold of the cell pitch h. First, in the single TSV 905, the TSV SOS is arranged to minimize a dead space by KOZ. The dead zone shown on the right side of FIG. 9A remains unchanged by arranging the plural TSVs in accordance with Equation (2) thereafter regardless of positions of the TSVs (integer-fold of cell pitch h. Here, b=5h).

Figure 9B:
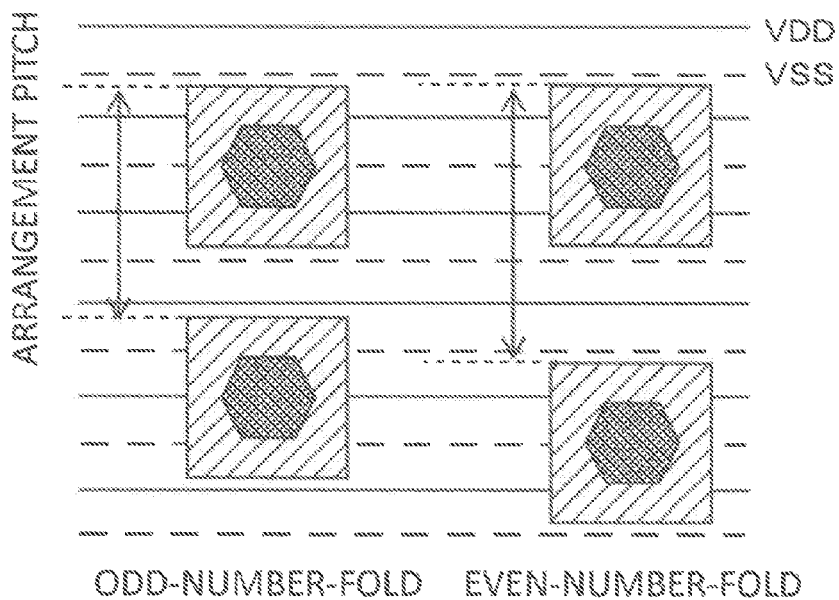
FIG. 9B is a view for explaining a positional relationship between a TSV and VDD line or VSS line when an arrangement pitch of the TSV is changed, a left side of the view shows a case where the arrangement pitch b is odd number-fold of the cell pitch h, and a right side thereof shows a case where the arrangement pitch b is even number-fold of the cell pitch h.

On the other hand, in a case of noncoincidence of the arrangement pitch (non-integer-fold of cell pitch h), KOZ traverses the power source line depending on the position of the TSV. In this case, the dead space is increased by an amount of one stage of the cell, pitch as shown on the left side of FIG. 9A. Therefore, it is preferable that the arrangement pitch of the TSV is made to be integer-fold of the cell pitch. FIG. 9B illustrates views for explaining a positional relationship between the TSV and VDD line or VSS line when the arrangement pitch of the TSV is changed, a left side thereof snows a case where the arrangement pitch b is odd number-fold of the cell pitch h (here, b=5h), and a right side thereof is a case where the arrangement pitch b is even number-fold of the cell pitch (here, b=6h). As shown on the right side of FIG. 9B, a power source wiring of the core circuit opposed to an end portion of KOZ of the TSV does not depend on the position of the TSV, and always stays to be the same kind by making the arrangement pitch even number-fold of the cell pitch. Therefore, a kind of FET opposed to the TSV can be made to stay the same, and therefore, KOZ of a total of the core circuit can be reduced by selecting the TSV having smaller KOZ. The dead space remains unchanged even when the position of the TSV differs as is also known from the left view of FIG. 9B, whereas the effect described above cannot be achieved in a case where the arrangement pitch b is odd number-fold of the cell pitch h. Also, in either of configurations of FIG. 9A and FIG. 9B, a circuit belonging to a TSV which differs from that of a standard cell can be inserted into a core circuit for effectively utilizing a dead space, and the situation can be made to be not dependent on the position of the TSV.

A reduction in a dead space and a reduction in KOZ can be realized not only by a single piece of TSV but plural TSVs by arranging the TSV in the core circuit by such a rule, and an arrangement efficiency of circuit elements can be improved in a total of the core circuit can be improved.

Figure 10:
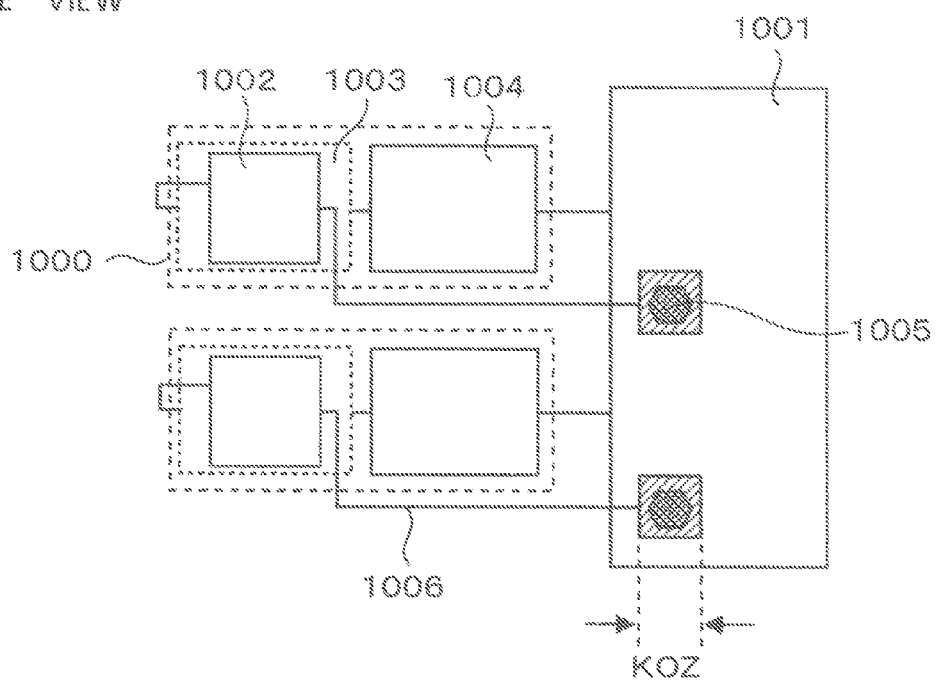
FIG. 10 illustrates views showing a connection between an IO circuit and a TSV in a chip configuring a semiconductor device according to the embodiment of the present invention, an upper view thereof is a plane view, and a lower view thereof is a sectional view.
Figure 10:
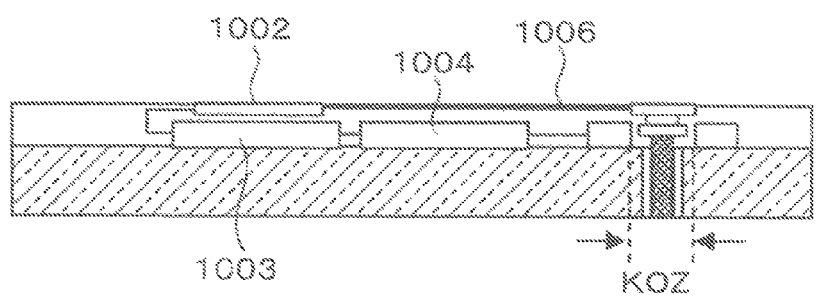

Thereafter, a TSV connected to a pad of an IO circuit is arranged at an inner portion of a core circuit. FIG. 10 illustrates views showing a connection of an IO circuit and a TSV in a chip configuring a semiconductor device according to the embodiment of the present invention, an upper view thereof is a plane view, and a lower view thereof is a sectional view. As shown in FIG. 10, a pad 1002 and a TSV 1005 are connected by a wiring 1006, and the TSV is arranged in a core circuit. KOZ of an IO circuit 1000 is replaced by KOZ of a core circuit 1001, and therefore, an efficiency of utilizing an area of the chip is improved in view of a total of the semiconductor chip. Also, a TSV which is not influenced by a pitch of the IO circuit 1000 can be arranged by arranging the TSV 1005 connected to the IO pad 1002 at the core circuit 1001. Incidentally, notation 1003 designates an ESD preventing diode, and notation 1004 designates an input/output buffer.

An explanation will be given of the present invention by embodiments as follows. The embodiments are examples of using the present invention, and the present invention is not limited by the examples.

First Embodiment

An explanation will be given of a first embodiment of the present invention as follows. The present embodiment is an example of arranging a TSV at a core circuit, and arranging a TSV having KOZ in a case where N=an even number in Equation (1) (in the present embodiment, N=6, 5h<a<6h). In a case of arranging a single piece of the TSV, as shown in FIG. 8, the TSV is arranged such that a center of the TSV is disposed on an extended line (which is not actually wired) of a power source (here, a second VSS line from top, or a second VSS line from bottom). An arrangement of a power source opposed to KOZ stays the same on upper and lower sides (here, VDD line). Generally, KOZ for NMOSFET is smaller than that of PMOSFET. Therefore, in a case where N can be made to be an even number, a VSS line is arranged to be opposed to the TSV. Plural TSVs are arranged, for example, as in FIG. 8. The arrangement pitch b of the TSV is made to be even number-fold of the cell pitch h, and made to be 12-fold in this example (b=12h). A power source line opposed to the TSV can be made always proximate to VSS (however, VDD line in FIG. 8), NMOSFET can always be proximate to KOZ by arranging in this way, which contributes to a reduction in KOZ, and therefore, a reduction in a dead space.

A reduction in power consumption and transmission delay, and a reduction in a mounting area by increasing an integration degree per footprint can be achieved as a result of fabricating a semiconductor device having a configuration shown in FIG. 8 by a publicly-known fabrication method.

As described above, according to the present embodiment, a semiconductor device having a high efficiency of arranging TSVs can be provided. Also, in a case where N of Equation (1) is an even number, KOZ can be reduced, and the dead space can be reduced by arranging the TSV such that the VSS line is opposed to the TSV.

Second Embodiment

An explanation will be given of a second embodiment of the present invention as follows. The present example is an example of arranging a TSV to a core circuit, and arranging a TSV having KOZ in a case where N is an odd number in Equation (1). (In the present embodiment, N=3, 2h<a<3h).

Figure 11:
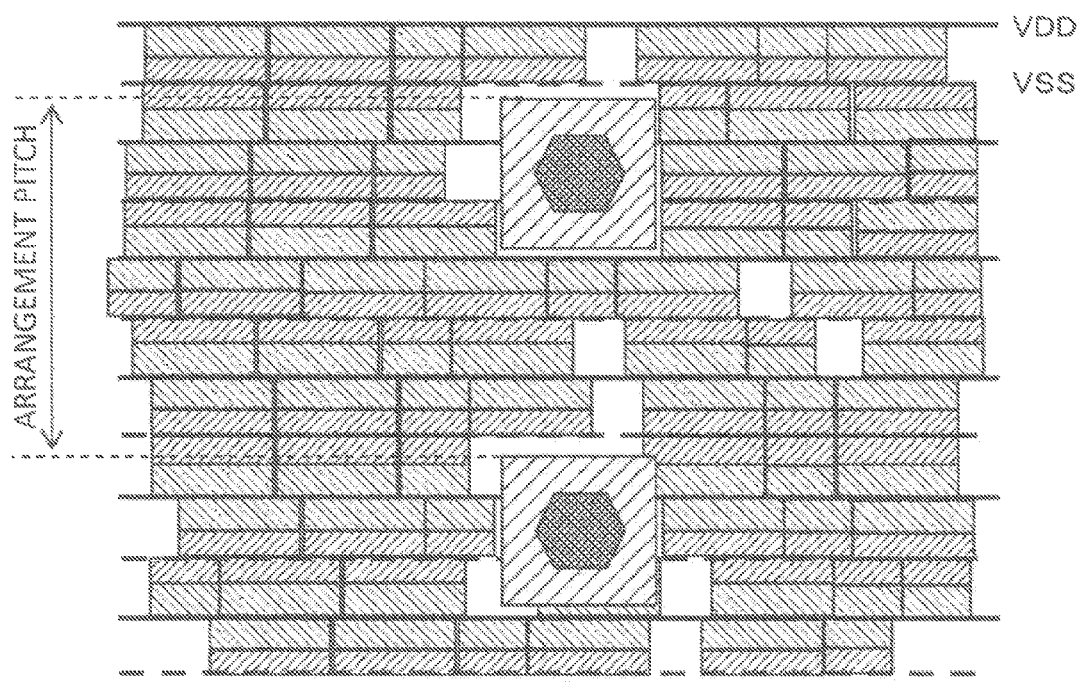
FIG. 11 is an arrangement view of a TSV in a core circuit in a chip configuring a semiconductor device according to a second embodiment of the present invention.

In a case of arranging a single piece of TSV, the TSV is arranged such that a center of the TSV is disposed at a portion on an extended line of a power source similar to FIG. 8. An arrangement of the power source opposed to KOZ differs between upper and lower sides. Although N is preferably an even number inherently, in a case where a size of KOZ and a dead space cannot be reduced, such an arrangement is established. FIG. 11 is a view of arranging a TSV in a core circuit in a chip configuring a semiconductor device according to the present embodiment. Plural TSVs are arranged as shown in FIG. 11 (however, here, an example of arranging a center of the TSV on an extended line of a boundary line of a PMOSFET area and an NMOSFET area of a standard cell is shown). The arrangement pitch b of the TSV is made to be even number-fold of the cell pitch h, or 6-fold in this example (b=6h). A relationship between upper and lower power lines opposed to the TSVs is always made to be constant by arranging in this way (here, the upper side is VSS line and lower side is VDD line which stays constant). The arrangement in this way contributes to a reduction in KOZ, and therefore, a reduction in a dead space.

A reduction in power consumption and transmission delay, and a reduction in a mounting area by increasing an integration degree per footprint can be achieved as a result of fabricating a semiconductor device having a configuration shown in FIG. 11 by a publicly-known fabrication method.

As described above, according to the present embodiment, a semiconductor device having a high efficiency of arranging TSVs can be provided.

Third Embodiment

Figure 13:
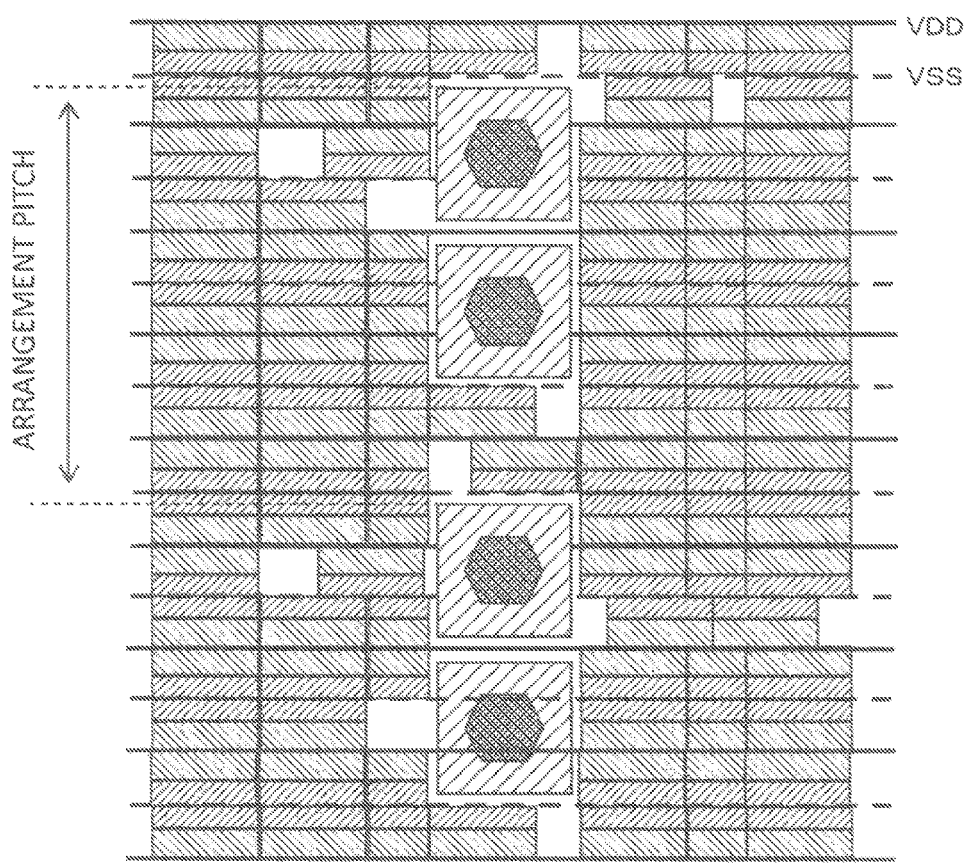
FIG. 13 is an arrangement view of a TSV in a core circuit in a chip configuring a semiconductor device according to a third embodiment of the present invention.

An explanation will be given of a third embodiment of the present invention as follows. The present example is other example of arranging a TSV in a core circuit as in the example of the second embodiment, and arranging a TSV having KOZ in which N is of a size of an odd number in Equation (1) (Here, N=3, 2h<a<3h). FIG. 13 is arrangement view of a TSV in a core circuit in a chip configuring a semiconductor device according to the present embodiment. As shown in FIG. 13, a minimum unit configuration is made by arranging at least 2 pieces of TSVs orthogonally to a direction of a power source line at an odd number-fold of a cell pitch (here, N=3) (here, a minimum unit is configured by 2 pieces of TSVs aligned in a cell pitch direction), and plural unit configurations thereof are arranged by even number-fold of the cell pitch (here, b≤8h). A coordinate of the unit configuration may be a coordinate of arranging one TSV configuring the unit configuration, or a gravitational center of the both TSVs.

A VSS line can be made to be proximate to an outer side of the minimum configuration unit as an opposed power source line, and NMOSFET can be made proximate to KOZ, which contributes to a reduction in KOZ, and therefore, a reduction in a dead space. An ordinary core circuit may be arranged, or an exclusive circuit used by plural TSVs will do for an inner side of the minimum configuration. For example, a differential output driver or a differential input amplifier configured in a core circuit is pointed out without using an IO circuit as the latter example.

A reduction in power consumption and transmission delay, a reduction in a mounting area by improving an integration degree per footprint can be achieved as a result of fabricating a semiconductor device having a configuration shown in FIG. 13 by a publicly-known fabricating method.

As described above, according to the present embodiment, a semiconductor device having a high efficiency of arranging a TSV can be provided.

Fourth Embodiment

Figure 4:
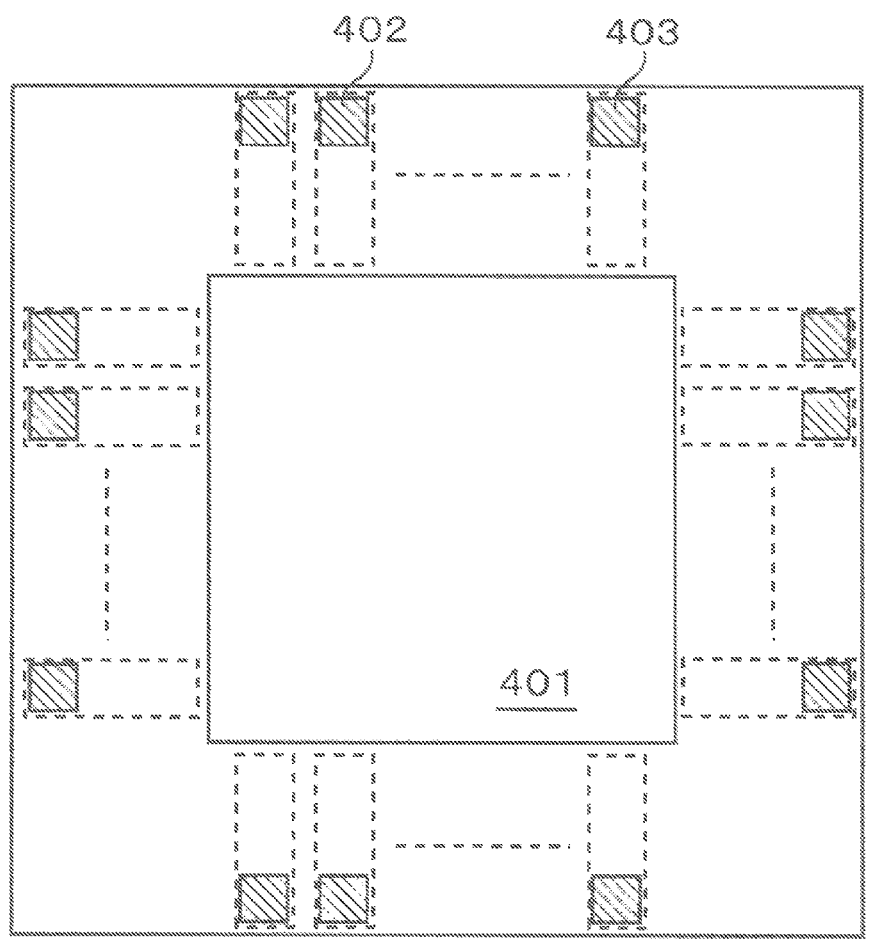
FIG. 4 is an outline plane view showing a positional relationship between a core circuit and an IO circuit in a chip configuring a semiconductor device stacked with chips.
Figure 5:
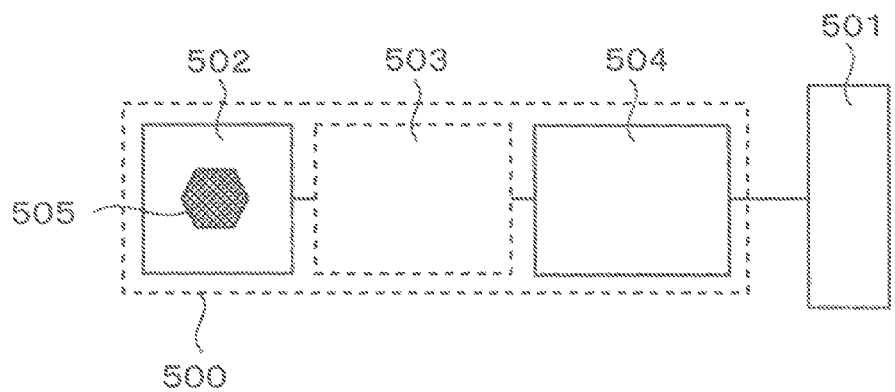
FIG. 5 illustrates views showing a configuration of an IO circuit and an arrangement of a TSV in a chip configuring a semiconductor device stacked with chips according to an investigation of the inventors, an upper view thereof is an outline plane view, and a lower view thereof is an outline sectional view.
Figure 5:
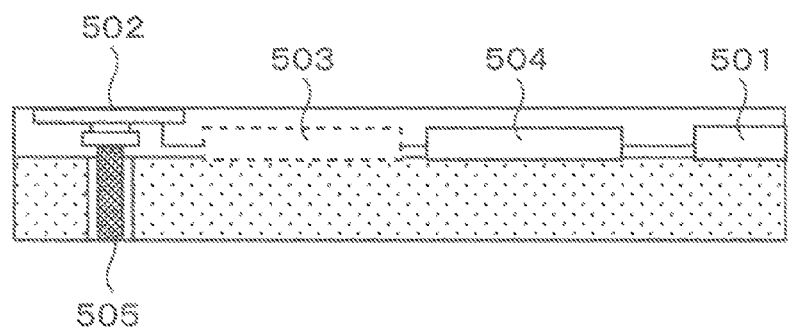
Figure 6A:
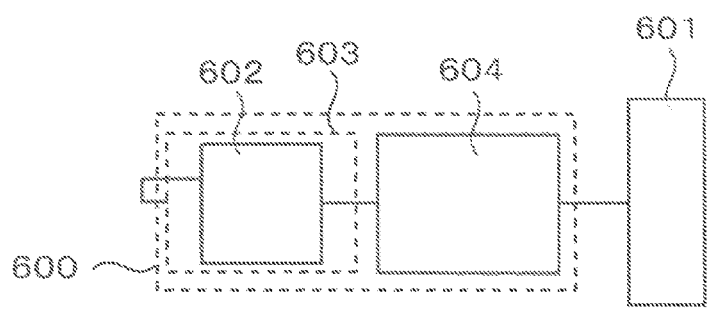
FIG. 6A illustrates views in a case where an IO circuit is highly integrated in a chip configuring a semiconductor device in which the chip is arranged on a plane, an upper view thereof is an outline plane view, and a lower view thereof is an outline sectional view.
Figure 6A:
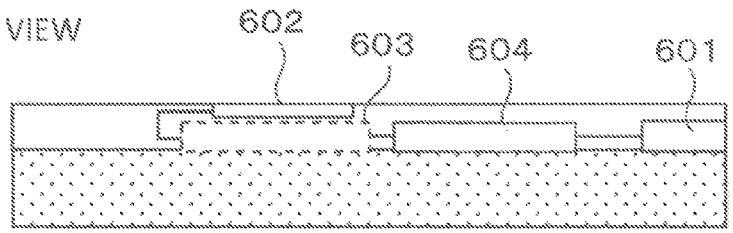
Figure 6B:
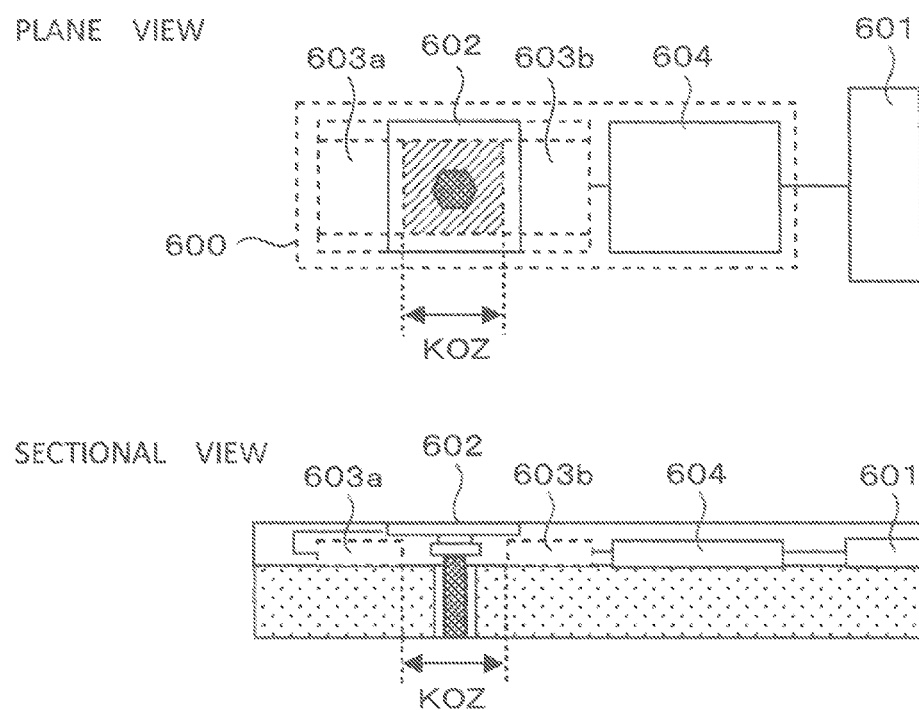
FIG. 6B illustrates views showing an arrangement of a TSV in a case where an IO circuit is highly integrated in accordance with a configuration of FIG. 6A in a chip configuring a semiconductor device stacked with chips according to an investigation of the inventors, an upper view thereof is an outline plane view, and a lower view thereof is an outline sectional view.
Figure 7B:
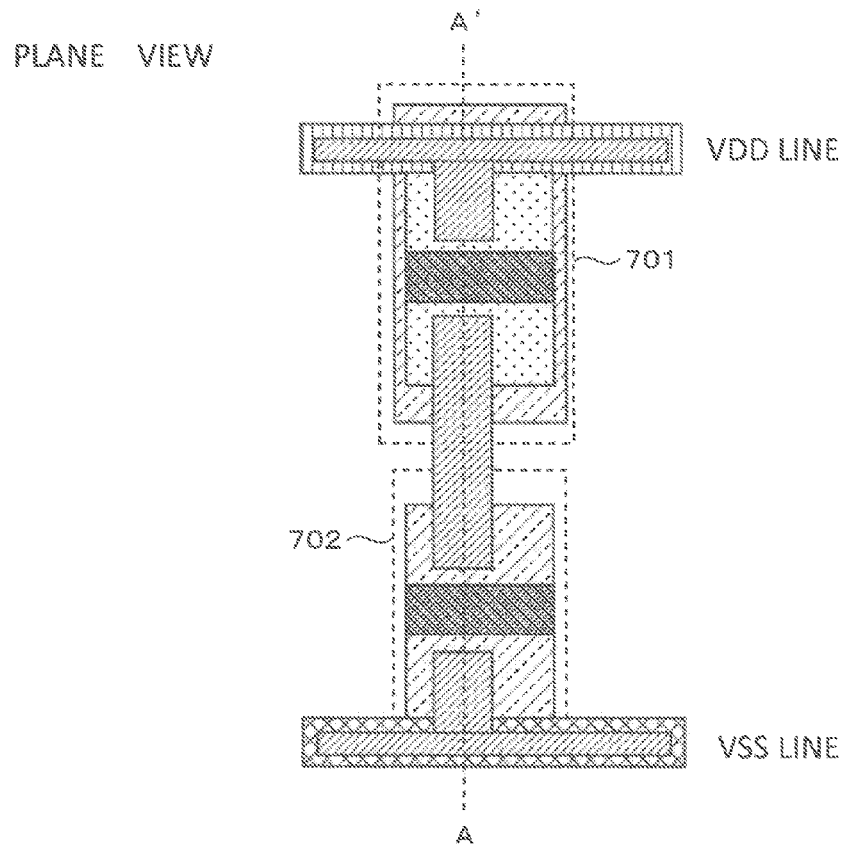
FIG. 7B illustrates detailed, views of the standard cell shown in FIG. 7A, an upper view thereof is a plane view, and a lower view thereof is a sectional view taken along a line AA'.
Figure 7B:
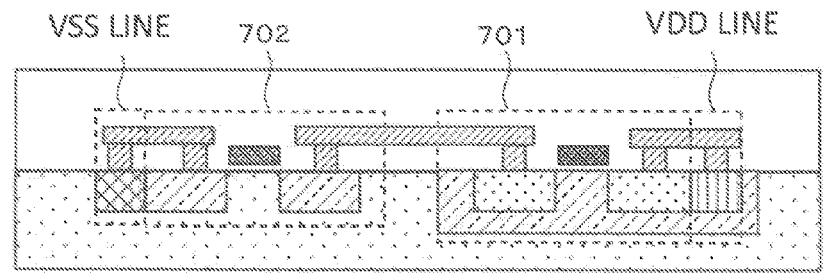
Figure 12:
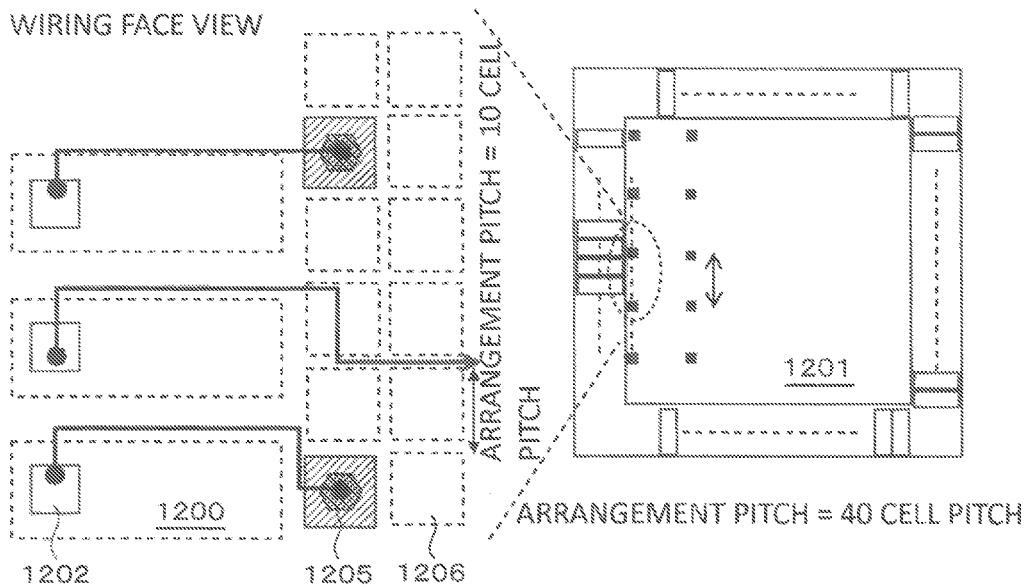
FIG. 12 illustrates plane views of a chip configuring a semiconductor device according to a fourth embodiment of the present invention, an upper right view is an outline view of a chip wiring face side, an upper left view is an enlarged view of an essential portion of the chip wiring face side for explaining a relationship of connecting an IO circuit and a TSV, and a lower view thereof is an outline view of a chip substrate face side.
Figure 12:
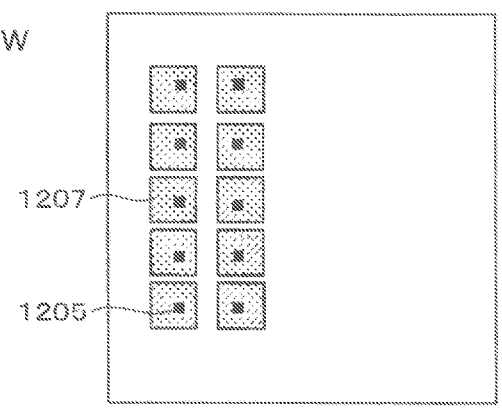

An explanation will be given of a fourth embodiment of the present invention as follows. The present example is an example of connecting an IO circuit to a TSV. FIG. 12 illustrates plane views of a chip configuring a semiconductor device according to the present embodiment, an upper right view is an outline view of a chip wiring face side, an upper left view is an enlarged view of an essential portion on the chip wiring face side for explaining a connection relationship between an IO circuit and a TSV, and a lower view is an outline view of a chip substrate face side. As shown in the upper left view of FIG. 12, a wiring is extended from a pad 1202 of an IO circuit 1200 and connected to a TSV 1205 arranged at a core circuit 1201. An arrangement of the IO circuit and the core circuit on a chip is made similar to that of FIG. 4.

It is pointed out as an advantage of the method to improve a degree of freedom of setting a pitch when a signal line and a power source line are taken out to outside of the chip. In a case where a pad pitch of the IO circuit 1200 is narrow, it is necessary to convert a pitch, by rewiring or other interposer until enabling to be mounted to a substrate as a secondary mounting item. Although the rewiring is a general technology, in a stacked chip, the chip is stacked thereon, and therefore, the rewiring is frequently difficult. The pitch can be enlarged to a mountable pitch by arranging the TSV 1205 to the core circuit 1201 while conforming to a rule that the arrangement interval is even number-fold of the cell pitch. Although according to the present embodiment, a candidate area 1206 of arranging a TSV is configured by an amount of 10 cell pitches, an interval of vias is enlarged to 40 cell pitches in consideration of the fact that an electrode (back face bump electrode) 1207 for secondary mounting is directly connected, to a mounting substrate at a back face thereof. An interposer for converting a pitch is dispensed with by using the present embodiment.

A reduction in power consumption and transmission delay and a reduction in a mounting area by improving an integration degree per footprint can be achieved as a result of fabricating a semiconductor device having a configuration shown in FIG. 12 by a publicly-known fabricating method.

As described above, according to the present embodiment, a semiconductor device having a high efficiency of arranging a TSV can be provided. Also, a pitch can be enlarged to a mountable pitch by arranging a TSV at a core circuit by conforming to a rule that an arrangement interval thereof is even number-fold of a cell pitch (a degree of freedom of setting a pitch is improved).

Fifth Embodiment

Figure 1A:
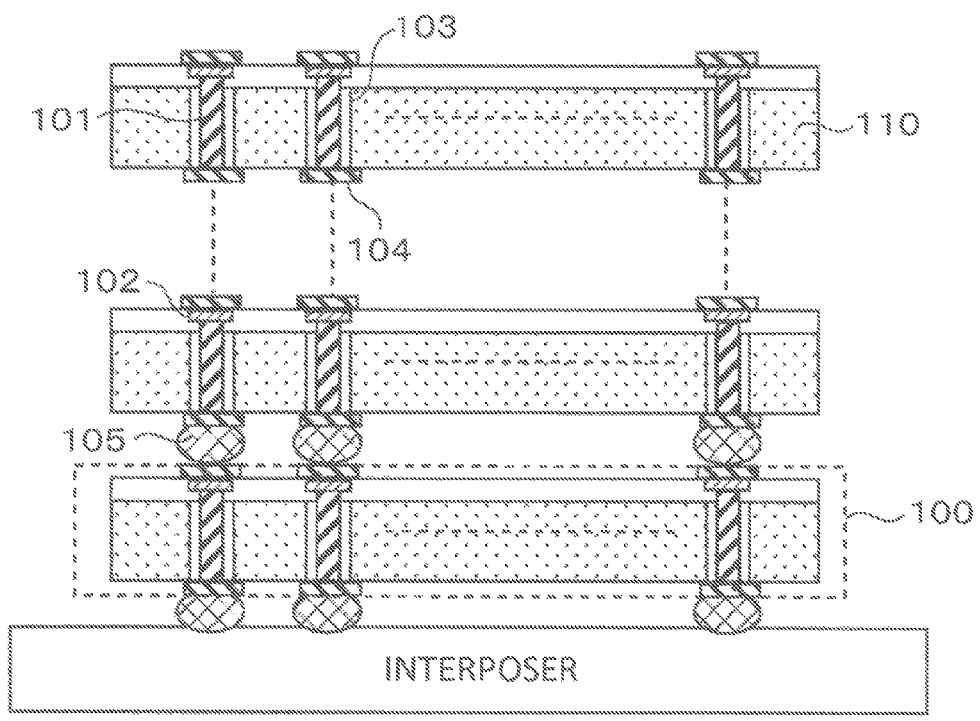
FIG. 1A is an outline sectional view showing an example of a semiconductor device stacked with a chip.
Figure 1B:
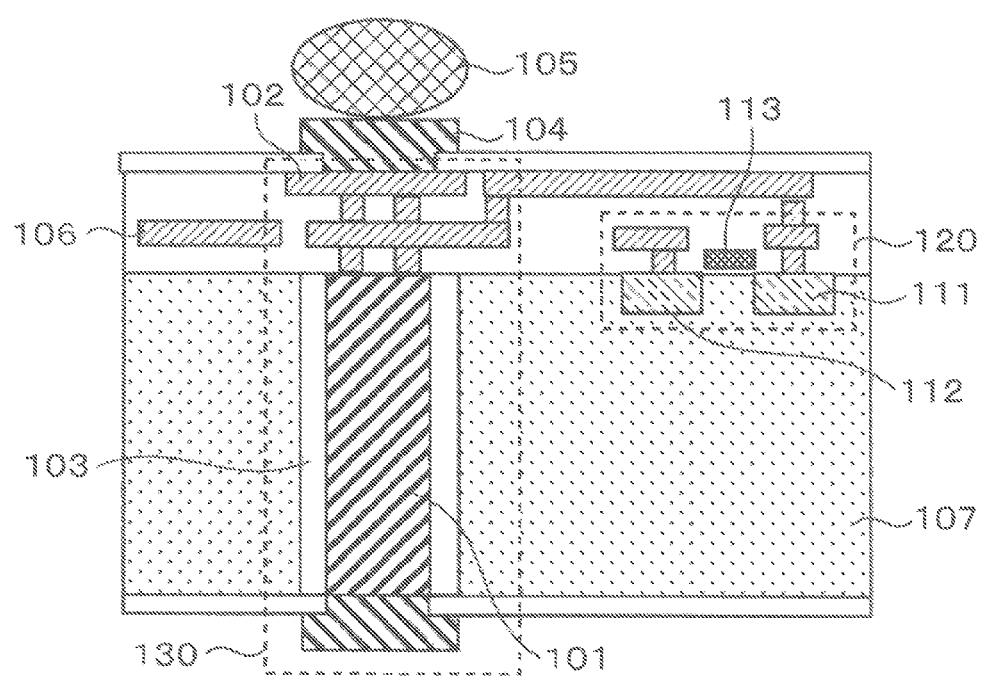
FIG. 1B is a detailed sectional view of the chip configuring the semiconductor device shown in FIG. 1A.
Figure 2A:
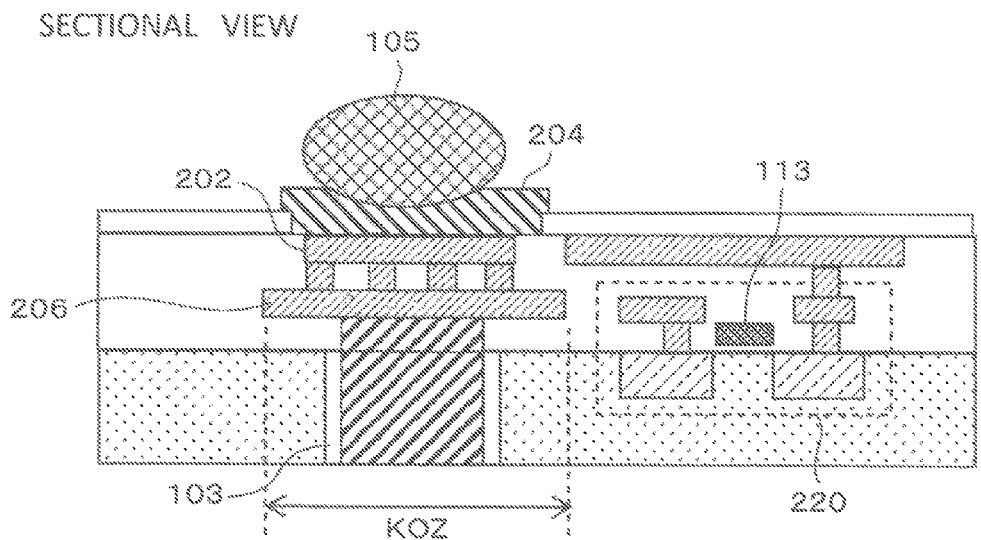
FIG. 2A illustrates views for explaining a relationship between a TSV and KOZ in a chip configuring a semiconductor device stacked with chips, an upper view thereof is a sectional view, and a lower view thereof is a plane view of an essential portion.
Figure 2A:
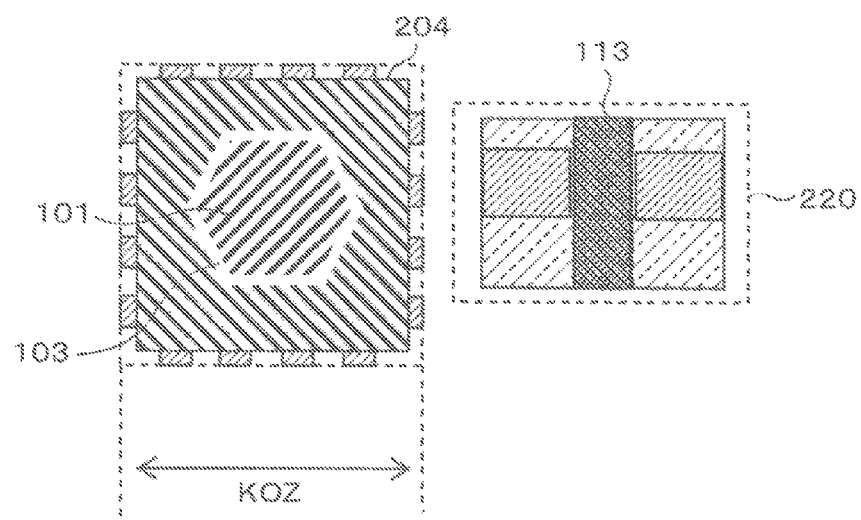
Figure 2B:
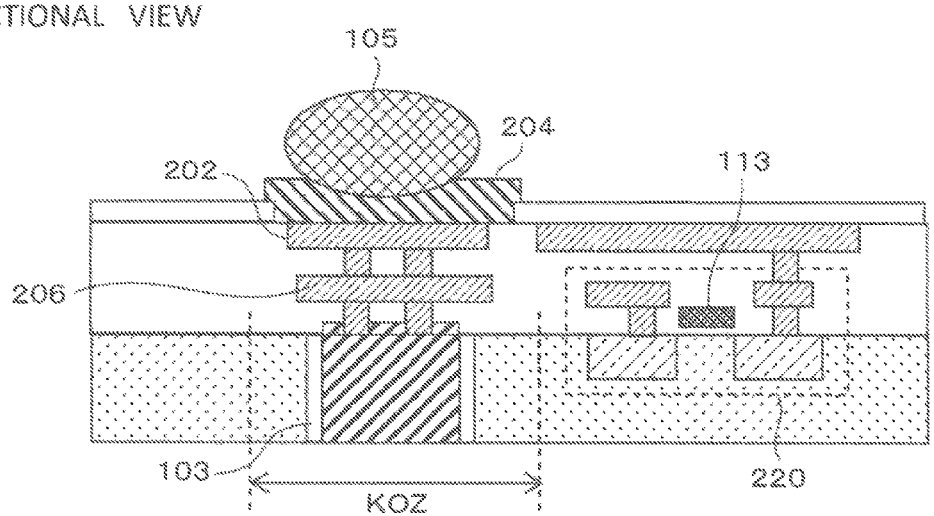
FIG. 2B illustrates views for explaining a relationship between a TSV and KOZ in a chip configuring other semiconductor device stacked with chips, an upper view thereof is a sectional view, and a lower view thereof is a plane view of an essential portion.
Figure 2B:
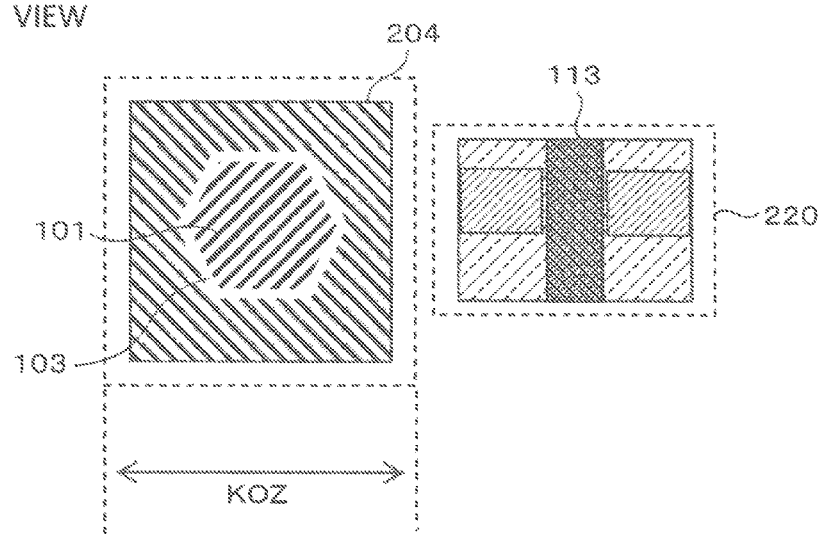
Figure 3A:
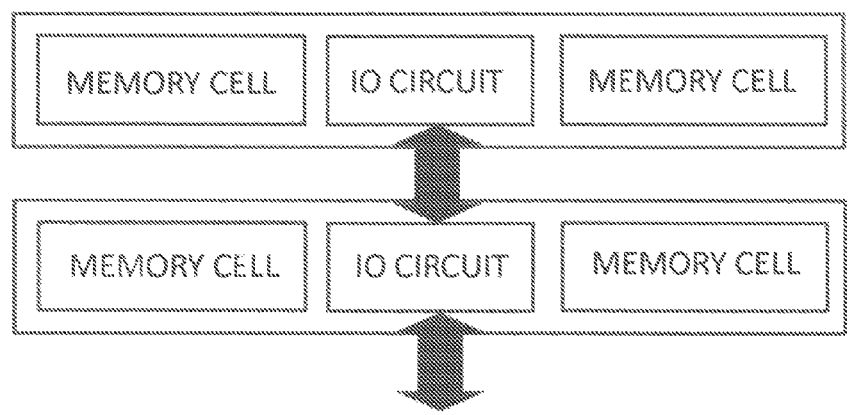
FIG. 3A is a conceptual view in a case where a TSV is mounted at a low density (TSV is arranged in IO circuit) in a semiconductor device stacked with chips.
Figure 3B:
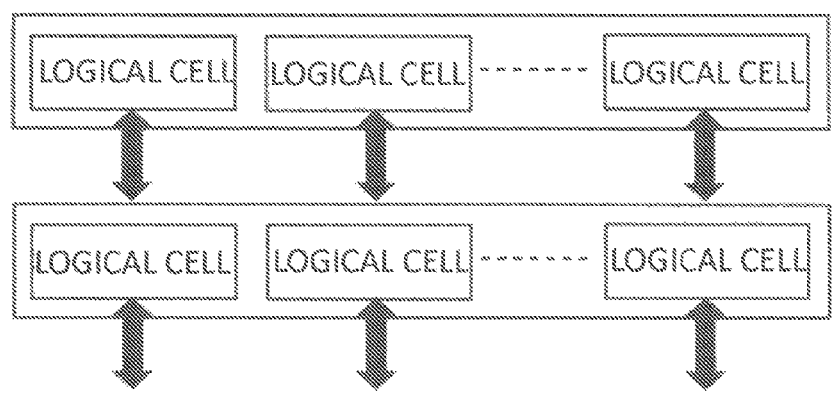
FIG. 3B is a conceptual view in a case where a TSV is mounted at a high density (TSV is arranged in logical cell) in a semiconductor device stacked with chips.

An explanation will be given of a fifth embodiment of the present invention as follows. Incidentally, an item which is described in any of the first embodiment through the third embodiment and is not described in the present embodiment is applicable also to the present embodiment so far as there is no particular reason. The present embodiment is an example of performing well power supply of connecting a silicon substrate at a periphery of a TSV to a VSS potential by using a power source wiring of a standard cell. As is apparent from FIGS. 1A and 1B, the TSV conductor 101 is brought into contact with the silicon substrate 107 via the insulating film 103. The TSV and the silicon substrate are electrically coupled by a parasitic capacitance formed by the TSV and the silicon substrate.

Figure 14:
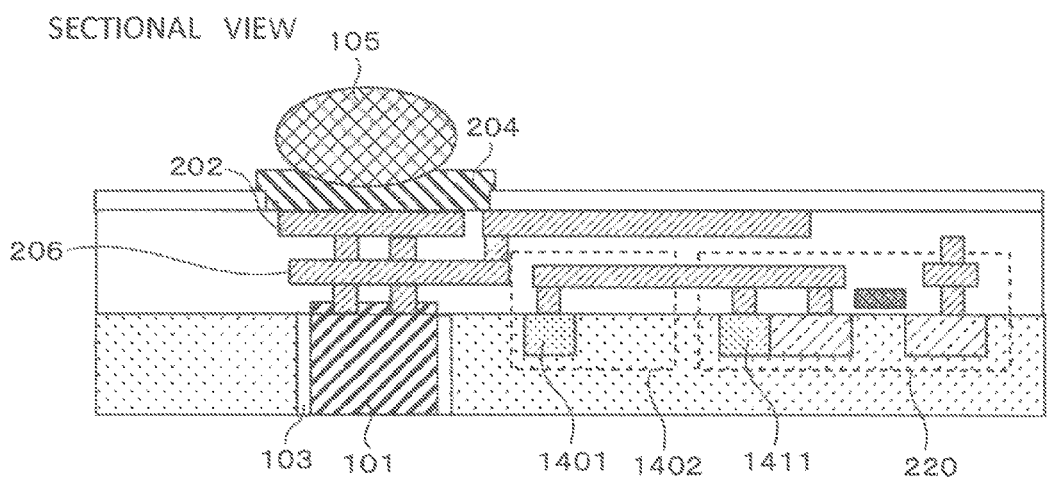
FIG. 14 illustrates views for explaining a well power supply structure of a TSV in a chip configuring a semiconductor device according to a fifth embodiment of the present invention, an upper view thereof is a sectional view, and a lower view thereof is a plane view of an essential portion.
Figure 14:
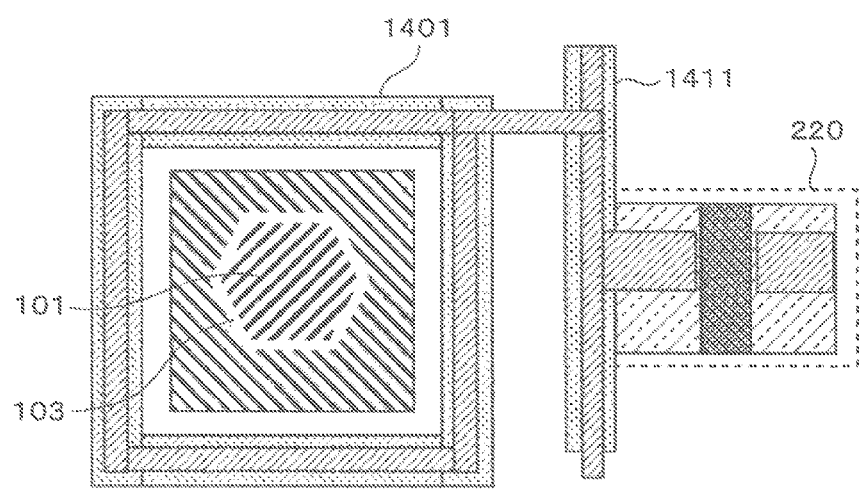

Therefore, a measure may be taken for weakening the coupling by forming a well at a silicon substrate at a periphery of the TSV and connecting the well to a power source potential in order to prohibit an influence of a signal passing the TSV from being effected on a surrounding circuit element, or prohibiting an influence in an inverse direction from being effected. FIG. 14 illustrates views for explaining a well power supply structure in a chip configuring a semiconductor device according to the present embodiment, an upper view thereof is a sectional view, and a lower view thereof us a plane view of an essential portion. Particularly in a case of a P type silicon substrate, a P$^+$ well 1401 injecting acceptor ions excessively to the substrate is formed and installed on a VSS side. FIG. 14 shows an example of arranging a well power supply structure 1402 and FET (here, NMOSFET of standard cell) 220 at a periphery of a TSV. The structure is equivalent to that of a VSS line 1411 of a standard cell. Because also a substrate potential of FET (here, NMOSFET standard cell) 220 connected to the VSS side of the standard cell needs to be grounded.

Figure 15:
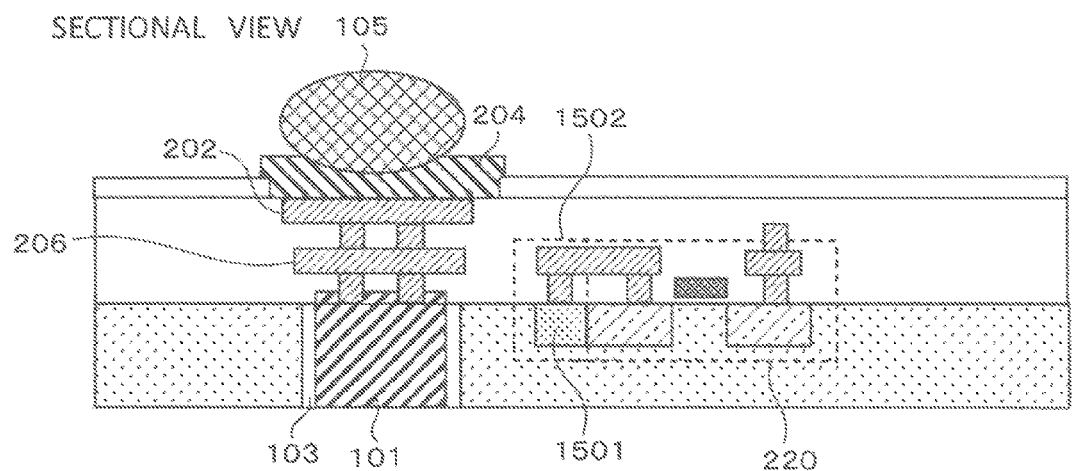
FIG. 15 illustrates views for explaining a well power supply structure of a TSV in a chip configuring other semiconductor device according to the fifth embodiment of the present invention; an upper view thereof is a sectional view, and a lower view thereof is a plane view of an essential portion.
Figure 15:
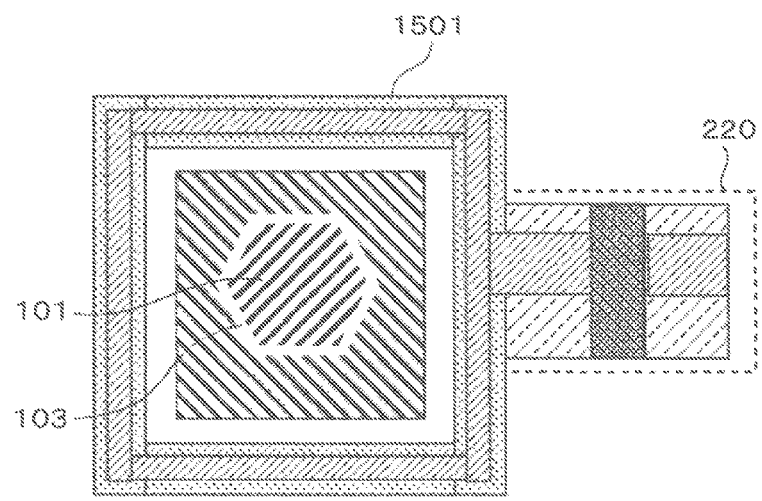

Here, when the TSVs are arranged at a pitch of even number-fold of a cell pitch as shown in the first embodiment, the TSV can be placed in a situation of capable of always being opposed to the VSS line. FIG. 15 illustrates views for explaining a well power supply structure of a TSV in a chip configuring other semiconductor device according to the present embodiment, an upper view thereof is a sectioned view, and a lower view thereof is a plane view of an essential portion. As shown, in FIG. 15, a structure 1502 using both of the well power supply structure and a power source line of a standard cell is enabled by forming a P$^+$ well 1501 on the VSS side. When the well power supply structure is arranged between the TSV and the standard cell, in a case where a distance of the TSV exceeds KOZ, the TSV and the power source line of the standard cell can be made proximate to each other in an allowable range of KOZ by using the both, and the space in the chip can be used more effectively.

A reduction in power consumption and transmission delay, a reduction in a mounting area by improving an integration, degree per footprint can be achieved as a result of fabricating the semiconductor device having a configuration shown in FIG. 15 by a publicly-known fabricating method.

As described above, according to the present embodiment, a semiconductor device having a nigh efficiency of arranging TSVs can be provided. Also, the space in the chip can be used more effectively by the structure using both of the well power supply structure and the power source line of the standard cell.

Sixth Embodiment

An explanation will be given of a sixth embodiment of the present invention as follows. Incidentally, an item which is described in any of the first embodiment through the third embodiment and is not described in the present embodiment is applicable also to the present embodiment so far as there is not a particular reason. Although the explanation has been given of the VSS line in the fifth embodiment, the present embodiment is an example of carrying out well power supply in which a silicon substrate at a periphery of a TSV is connected to a VDD potential by using a power source line of a standard cell. Particularly in a case of an N type silicon substrate, an N$^+$ well 1601 injecting donor ions excessively to a substrate is formed and installed on the VDD side. The structure is equivalent also in VDD line of a standard cell. Because also a substrate potential of FET (here, PMOSFET) 220 connected to a VDD side of the standard cell needs to be grounded to VDD.

Figure 16:
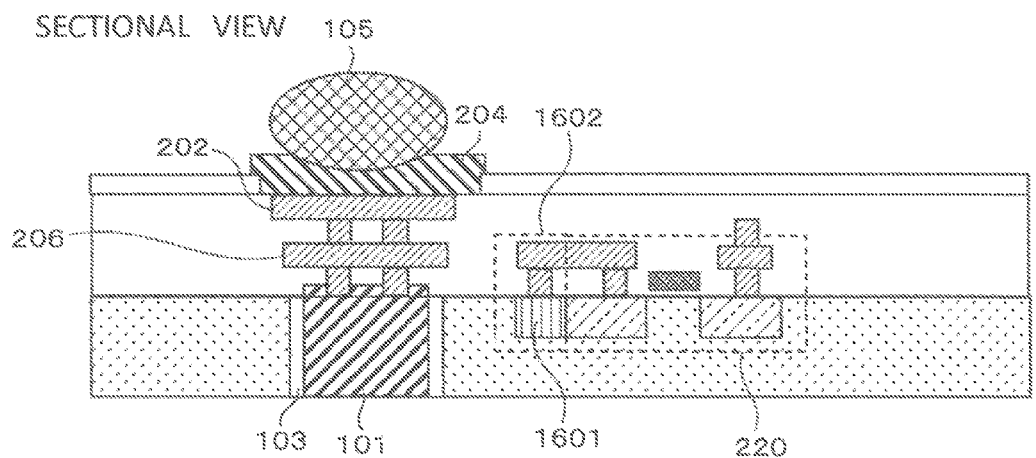
FIG. 16 illustrates views for explaining a well power supply structure of a TSV in a chip configuring a semiconductor device according to a sixth embodiment of the present invention, an upper view thereof a sectional view, and a lower view thereof is a plane view of an essential portion.
Figure 16:
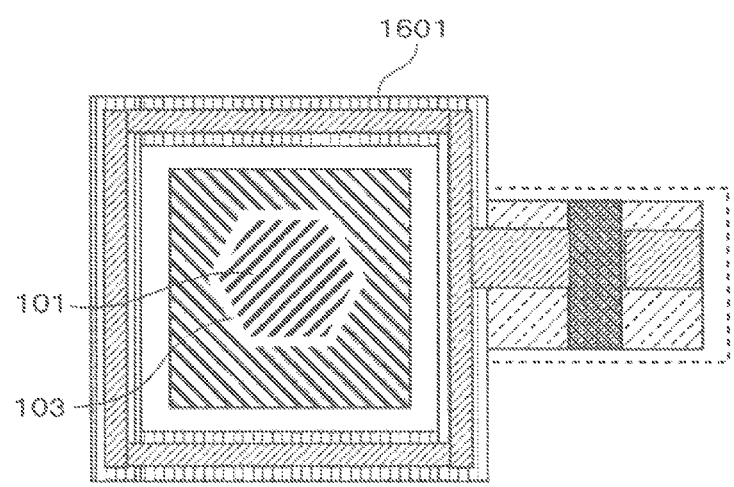

Here, when TSVs are arranged at a pitch of even number fold of a cell pitch as shown, in the first embodiment, the TSV can be placed in a situation capable of always being opposed to the VDD line. FIG. 16 illustrates views for explaining a well power supply structure of a TSV in a chip configuring a semiconductor device according to the present embodiment, an upper view thereof is a sectional view, and a lower view thereof is a plane view of an essential portion. As shown in FIG. 16, both of a well power supply structure and a power source line of a standard cell can be used. When a well, power supply structure is arranged between a TSV and a standard cell, in a case where a distance of the TSV exceeds KOZ, the TSV and a power source line of a standard cell can be made proximate to each other in an allowable range of KOZ by the both using structure 1602, and the space in the chip can be used more effectively.

A reduction in power consumption and transmission delay, and a reduction in an amounting area by improving an integration degree per footprint can be achieved as a result of fabricating a semiconductor device having a configuration shown in FIG. 16 by a publicly-known method.

As described above, according to the present embodiment, a semiconductor device having a high efficiency of arranging TSVs can be provided. Also, the space in the chip can be used more effectively by the structure of using both of the well power supply structure and the power source line of the standard cell.

Incidentally, the present invention is not limited to the embodiments described above but includes various modified examples. For example, the embodiments described above have been explained in details in order to explain to be easy to understand the present invention, and are not necessarily limited to what includes all of the configurations. Also, a portion of a configuration of a certain embodiment can be replaced by a configuration of other embodiment, and the configuration of the other embodiment can also be added to the certain embodiment. Addition, deletion, or replacement of other configuration can be carried out for portions of configurations of the respective embodiments.

What is claimed is:

1. A semiconductor device, comprising:
    a plurality of stacked semiconductor chips, each semiconductor chip being electrically connected to at least one adjacent semiconductor chip using Through Silicon Vias (TSVs),
    wherein at least one semiconductor chip of the plurality of stacked semiconductor chips has an IO circuit and a core circuit including a plurality of VDD power lines, a plurality of VSS power lines, a plurality of cells disposed between the VDD and VSS power lines, and a plurality of TSVs, each TSV being surrounded by a Keep Out Zone (KOZ), each KOZ defining a region of the semiconductor chip in which circuit elements are not disposed,
    wherein the VDD power lines and the VSS power lines are parallel and arranged alternately at a constant interval that defines a cell pitch in a first direction,
    wherein the TSVs are arranged at a different constant interval, and the distance between the upper borders of adjacent KOZs defines an arrangement pitch in the first direction, and
    wherein the arrangement pitch is an integer multiple of the cell pitch.

2. The semiconductor device according to claim 1, wherein the arrangement pitch is an even integer multiple of the cell pitch.

3. The semiconductor device according to claim 2, wherein each of the plurality of TSVs is opposed to one of the plurality of VSS power lines of the core circuit.

4. The semiconductor device according to claim 3, wherein each TSV has a well power supply line, and wherein each well power supply line is also used as the VSS power line.

5. The semiconductor device according to claim 2, wherein each of the plurality of TSVs is opposed to one of the VDD power lines of the core circuit.

6. The semiconductor device according to claim 5, wherein each TSV has a well power supply line, and wherein each well power supply line is also used as the VDD power line.

7. The semiconductor device according to claim 1, wherein the plurality of TSVs include a first TSV group configured by two or more of the TSVs contiguous to each other and a second TSV group configured by as many TSVs as those of the first TSV group and a third TSV group configured by as many TSVs as those of the first TSV group, and wherein a pitch of arranging the TSV groups is an even integer-multiple of the cell pitch.

8. The semiconductor device according to claim 1, wherein each KOZ has a width a, in the first direction, given by:

$$(N-1)*h<a<N*h$$

where N is an integer, and h is the cell pitch.

9. The semiconductor device according to claim 8, wherein the arrangement pitch b is given by:

$$b=2*M*h \text{ for } 2*M>N$$

where M is an integer.

10. A semiconductor device, comprising:
    a plurality of stacked semiconductor chips, each semiconductor chip being electrically connected to at least one adjacent semiconductor chip using Through Silicon Vias (TSVs);
    wherein at least one semiconductor chip of the plurality of stacked semiconductor chips has a core circuit and a plurality of IO circuits surrounding the core circuit, each IO circuit including a pad electrode, the core circuit including a plurality of VDD power lines, a plurality of VSS power lines, a plurality of cells disposed between the VDD and VSS power lines, and a plurality of TSVs, each TSV being surrounded by a Keep Out Zone (KOZ), each KOZ defining a region of the semiconductor chip in which circuit elements are not disposed,
    wherein the VDD power lines and the VSS power lines are parallel and arranged alternately at a constant interval that defines a cell pitch in a first direction,
    wherein the TSVs are arranged at a different constant interval, and the distance between the upper borders of adjacent KOZs defines an arrangement pitch in the first direction, and
    wherein each TSV is connected to the pad electrode of one of the IO circuits, and
    wherein the arrangement pitch is an integer multiple of the cell pitch.

11. The semiconductor device according to claim 10, wherein the arrangement pitch is an even integer multiple of the cell pitch.

12. The semiconductor device according to claim 11, wherein the arrangement pitch is set to be enlarged so as to enable to directly mount on a substrate mounted with the semiconductor chip.

13. The semiconductor device according to claim 10, wherein each KOZ has a width a, in the first direction, given by:

$$(N-1)*h<a<N*h$$

where N is an integer, and h is the cell pitch.

14. The semiconductor device according to claim 13, wherein the arrangement pitch b is given by:

$$b=2*M*h \text{ for } 2*M>N$$

where M is an integer.

* * * * *